United States Patent

Sudo

[11] Patent Number: 5,198,684
[45] Date of Patent: Mar. 30, 1993

[54] SEMICONDUCTOR INTEGRATED CIRCUIT DEVICE WITH OPTICAL TRANSMIT-RECEIVE MEANS

[75] Inventor: Toshio Sudo, Kawasaki, Japan

[73] Assignee: Kabushiki Kaisha Toshiba, Kawasaki, Japan

[21] Appl. No.: 744,718

[22] Filed: Aug. 14, 1991

[30] Foreign Application Priority Data

Aug. 15, 1990 [JP] Japan .................. 2-215485

[51] Int. Cl.$^5$ .......................................... H01L 31/12
[52] U.S. Cl. ........................................ 257/79; 257/80; 257/84; 257/81; 257/82; 372/50; 385/35; 250/227.11; 359/566; 361/393
[58] Field of Search ............. 357/19, 74, 75, 76, 357/17, 30 P, 30 G, 55, 80, 45, 32; 250/571, 227.11, 227.24; 372/50; 385/35, 37; 359/566; 361/393, 394, 416, 420

[56] References Cited

U.S. PATENT DOCUMENTS

| | | | |
|---|---|---|---|
| 4,720,634 | 1/1988 | D'Auria et al. | 250/551 |
| 5,047,835 | 9/1991 | Chang | 357/19 X |
| 5,051,790 | 9/1991 | Hammer | 357/19 |
| 5,093,879 | 3/1992 | Bregman et al. | 250/227.11 X |

FOREIGN PATENT DOCUMENTS

| | | | |
|---|---|---|---|
| 0230112 | 11/1985 | Fed. Rep. of Germany | 357/19 |
| 0267647 | 5/1989 | Fed. Rep. of Germany | 357/19 |
| 58-90764 | 5/1983 | Japan | 357/19 |

OTHER PUBLICATIONS

Hornak, "Fresnel Phase Plate Lenses For Through-Wafer Optical Interconnections", *Applied Optics*, Sep. 1, 1987, vol. 26, No. 17, pp. 3649–3654.
Hornak, "Through-Wafer Optical Interconnection Coupling Characteristics", Electronic Letters, May 26, 1988, vol. 24, No. 11, pp. 714–715.

*Primary Examiner*—William Mintel
*Attorney, Agent, or Firm*—Oblon, Spivak, McClelland, Maier & Neustadt

[57] ABSTRACT

A semiconductor integrated circuit device comprising a plurality of semiconductor packaging substrates arranged parallel to one another, a plurality of semiconductor integrated circuits mounted on each of the semiconductor packaging substrates, a circuit for electrically connecting the semiconductor integrated circuits, an optical signal transmitting circuit, electrically connected to the semiconductor integrated circuits, for converting an electric signal input by the semiconductor integrated circuits to an optical signal and outputting it to another semiconductor packaging substrate, and an optical signal receiving circuit, electrically connected to the semiconductor integrated circuits, for receiving the optical signal output from the semiconductor packaging substrate, converting the optical signal to an electric signal, and outputting the electric signal to the semiconductor integrated circuits.

15 Claims, 8 Drawing Sheets

SEMICONDUCTOR INTEGRATED CIRCUIT DEVICE WITH OPTICAL TRANSMIT-RECEIVE MEANS

BACKGROUND OF THE INVENTION

1. Field of the Invention

This invention relates to a semiconductor integrated circuit device comprising a plurality of semiconductor packaging substrates.

2. Description of the Related Art

In order to constitute a multifunctional electronic device by using integrated circuits, it has been required to incorporate a greater number of semiconductor elements in a semiconductor integrated circuit. As the integrated circuit technique has been greatly improved, the integration density and the operation speed of a semiconductor circuit has become higher and higher. By the improvement of the integrated circuit technique, the number of input and output terminals of an integrated circuit has been increased to 500 or more, and it will be 1000 in near future.

However, when an integrated circuit having a great number of pins is mounted on an ordinary substrate such as a PGA (Pin Grid Array) or a QFP (Quad Flat Package), an outer side of the package of the integrated circuit is longer than 5 cm. In fact, a conventional semiconductor integrated circuit mounted on a printed board has the drawbacks that the integration density cannot be improved and the full use of all circuit functions cannot be realized.

In order to overcome the drawbacks, a method of mounting semiconductor integrated circuits on the above-mentioned substrate by a TAB (Tape Automated Bonding) method or a flip chip bonding method has been developed in recent years, whereby an insulating layer made of polyimide and a predetermined fine wire made of conductive material such as copper are formed in sequence on the substrate.

However, a high density semiconductor integrated circuit device wherein many semiconductor integrated circuits are incorporated, i.e., a semiconductor integrated circuit device constituted by a plurality of semiconductor packaging substrates electrically connected to one another, cannot operate at its maximum performance on account of a signal delay time. For example, in a parallel arithmetic processing device constituted by a plurality of processors, since the processors are connected by a large number of signal wires, it is necessary to increase the signal transmission speed in every wire to improve processing performance of the entire device. However, since the semiconductor integrated circuit device of a high integration density inevitably includes a portion in which impedance matching is not obtained, for example, a connecting portion between processors, it is difficult to maintain a constant characteristic impedance throughout the overall wiring path. As a result, signal reflection and distortion of a signal waveform will occur. Moreover, since crosstalk easily occurs with a narrow interval between signal wires, noise is superposed on a signal. Consequently, it is difficult to electrically transmit a signal with high speed between processors. In the semiconductor integrated circuit device constituted by electrically connecting semiconductor packaging substrates each having a number of integrated circuits, the signal waveform is degraded by connectors and the delay time due to a back plane is increased, since a signal is transmitted between packaging substrates through an electric path. As a result, the device cannot perform its function satisfactorily.

In summary, the above-described conventional integrated circuit device, which is constituted by high-density semiconductor packaging substrates electrically connected by TAB or flip chip bonding method, has the following drawbacks: (1) distortion occurs in a signal waveform; (2) the delay time in signal transmission increases; and (3) the semiconductor integrated circuit device does not operate efficiently.

The conventional art related to the present invention is reported by L. A. Hornak, "*Fresnel phase lenses for through-wafer optical interconnections*"; APPLIED OPTICS, Vol. 26, No. 17, pp. 3469-3654, 1 Sep. (1987) and L. A. Hornek, "*Through-wafer Optical Interconnection Coupling Characteristics*"; ELECTRONICS LETTERS Vol. 21, No. 11, pp. 714-715, 26 May (1988) and disclosed in U.S. Pat. No. 4,720,634, 19 Jan. (1988).

SUMMARY OF THE INVENTION

Accordingly, an object of the present invention is to provide a high-performance semiconductor integrated circuit device wherein distortion of a signal waveform, which may occur in a signal transmission path between semiconductor packaging substrates, is prevented and the delay time is decreased.

To achieve the object, a semiconductor integrated circuit device according to a first aspect of the present invention comprises:

a plurality of semiconductor packaging substrates arranged parallel to one another;

at least one opening selectively formed on each of said semiconductor packaging substrates;

a plurality of semiconductor integrated circuits mounted on that portion of each of said semiconductor packaging substrates which excludes said opening, and for performing predetermined process;

a plurality of light transmit-receive means formed over each opening, for performing a optical signal transmission between said semiconductor packaging substrates, said light transmit-receive means converting electric signals output from a semiconductor integrated circuit on one semiconductor packaging substrate to an optical signal and outputting the optical signal to another semiconductor packaging substrate, and converting an optical signal received from another semiconductor packaging substrate to electric signals and outputting the electric signal to said semiconductor integrated circuits; and wires for electrically connecting said semiconductor integrated circuits on each of said semiconductor packaging substrates to said light transmit-receive means.

According to the first aspect of the present invention, there is provided a semiconductor integrated circuit device wherein the semiconductor packaging substrates may be made of any type of material.

A semiconductor integrated circuit device according to a second aspect of the present invention comprises:

two semiconductor packaging substrates, each having at least one opening, superposed on each another such that the position of the opening in one substrate corresponds to that of another substrate;

a plurality of semiconductor integrated circuits selectively mounted on that portion of the exposed surfaces of said semiconductor packaging substrates which excludes said opening;

a lens provided in each opening;

light transmit-receive elements covering the ends of each side of the openings;

wires for electrically connecting said semiconductor integrated circuits on each of said semiconductor packaging substrates to said light transmit-receive means.

According to the second aspect of the present invention, there is provided a semiconductor integrated circuit device in which semiconductor integrated circuits are incorporated to a higher integration density than the integrated circuit devices according to the first aspect of the invention.

A semiconductor integrated circuit device according to a third aspect of the present invention comprises:

a plurality of semiconductor packaging substrates arranged parallel to one another;

a plurality of semiconductor integrated circuits mounted on each of said semiconductor packaging substrates and performing a predetermined process;

connecting means for electrically connecting said semiconductor integrated circuits on each of said semiconductor packaging substrates;

optical signal transmitting means, electrically connected to said semiconductor integrated circuits on each of said semiconductor packaging substrates, for converting electric signals input by said semiconductor integrated circuits on one semiconductor packaging substrate to an optical signal and outputting the optical signal to another semiconductor packaging substrate; and optical signal receiving means, electrically connected to said semiconductor integrated circuits on each of said semiconductor integrated circuit substrates, for receiving an optical signal output from one semiconductor packaging substrate, converting the optical signal to electric signals, and outputting the electric signals to said semiconductor integrated circuit.

It is preferable that the semiconductor packaging substrate is made of transparent AlN.

In addition, it is preferable that the optical signal receiving means are formed of a photodiode and the optical signal transmitting means are formed of a light emitting diode and a semiconductor laser, and they are formed integral with each other to form a light transmit-receive means.

It is preferable that the light transmit-receive means is formed of a photodiode and a semiconductor laser and formed integral with each other.

According to the first, second and third aspects of this invention, since the thermal expansion of the semiconductor packaging substrate is substantially equal to that of semiconductor integrated circuit, high reliability of the connection between the substrate and the semiconductor integrated circuit can be obtained and highly concentrated packaging of the semiconductor integrated circuit onto the substrate can be formed.

When a light transmit-receive element is operated, it generates a great amount of heat. The heat generated in the light transmit-receive element is released by the silicon substrate or Al substrate having high heat conductivity. Therefore, there is no problem when the light transmit-receive element is operated.

In addition, the semiconductor integrated circuit device of the present invention has the following advantages:

1) Since a plurality of semiconductor integrated circuits on one semiconductor packaging substrate are electrically connected with one another, a signal can be processed at high speed.

2) Since a signal is transmitted between semiconductor packaging substrates via an optical transmission path, the signal transmission rate is higher than with signal transmission via an electrical transmission path.

3) Since semiconductor packaging substrates are connected by light, signal reflection due to impedance mismatching does not occur.

4) Since the signal interference occurs little, the crosstalk noise is decreased and the signal delay does not depend on the time constant of the wire resistance and its capacitance.

These advantages decrease the factors which affect high-speed signal transmission adversely, and the operation capacity of the device is greatly improved.

In addition, since a signal is transmitted between semiconductor packaging substrates by means of light via a light transmit-receive element mounted on each of the substrates, the following effects are obtained:

1) The delay time is reduced.

2) No connector is required to connect packaging substrates.

3) Noise arising from impedance mismatching and electromagnetic interference between adjacent wires is prevented.

Consequently, a high-speed and reliable semiconductor integrated circuit device is obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described below with reference to the accompanying drawings.

Figure 1:
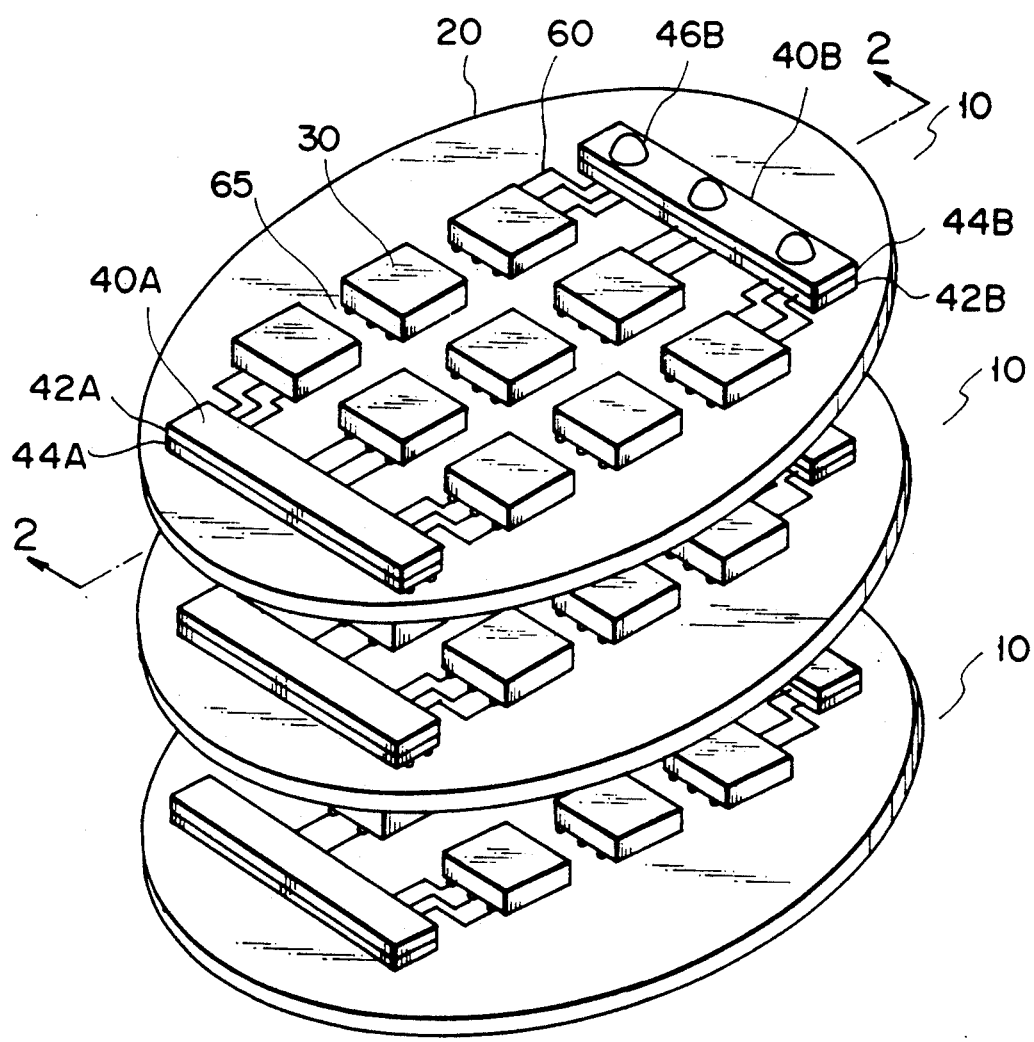
FIG. 1 is a perspective view schematically showing a semiconductor integrated circuit device according to a first embodiment of the present invention.
Figure 2:
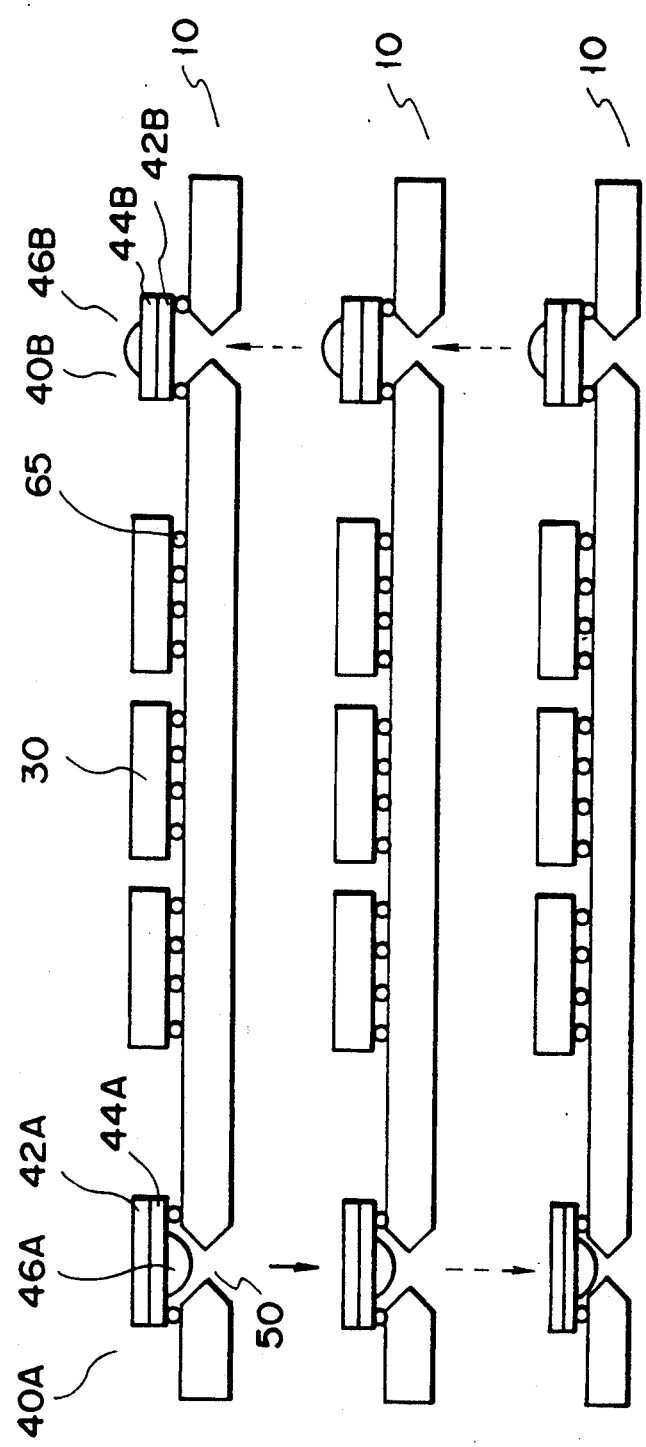
FIG. 2 is a cross-sectional view of the semiconductor integrated circuit device shown in FIG. 1 taken along the line 2—2.

FIG. 1 is a perspective view showing part of the semiconductor integrated circuit device according to a first embodiment of the present invention, and FIG. 2 is a cross-sectional view of the semiconductor integrated circuit device shown in FIG. 1 taken along the line 2—2.

As is shown in FIGS. 1 and 2, the semiconductor integrated circuit device is constituted by a plurality of semiconductor packaging substrates 10 superposed at regular intervals. The interval between semiconductor packaging substrates 10 is determined by the focal length of lenses 46A and 46B (to be described later). Each semiconductor packaging substrate 10 comprises a circular silicon substrate 20, a predetermined number of semiconductor integrated circuits 30 mounted on the center portion of the substrate 20, and light transmit-receive elements (formed by units or arrays) 40A and 40B disposed at openings 50 provided on both sides of the center portion of the substrate 20. The elements 40A and 40B respectively comprise photodiode chips 42A and 42B, and semiconductor laser chips 44A and 44B.

A silicon substrate 20, the semiconductor integrated circuits 30 and the light transmit-receive elements 40A and 40B are interconnected by the flip chip bonding method. The semiconductor packaging substrate 10 is made the steps of in the following manner. First, polyimide is spin-coated on the silicon substrate 20. After polyimide is dried, an interlayer insulating film is formed on the silicon substrate 20. A conductive material such as copper is deposited on the interlayer insulating film by vapor deposition or sputtering process, thereby forming a metal layer. The metal layer is patterned by means of photolithography, thereby forming multilayered wires 60. The semiconductor integrated circuits 30, the light transmit-receive elements 40A and 40B, on which solder bumps 65 are formed, are connected to the multilayered wires 60 by the face down method.

The distance between adjacent silicon substrates 20 is determined by the focal length of the lenses 46A and 46B. On the silicon substrate 20, the light transmit-receive element 40A (shown in the left portion of FIG. 2) is mounted with the photodiode chip 42A provided on top thereof, the light transmit-receive element 40B (shown in the right portion of FIG. 2) with the light emitting element 44B provided thereunder. The light emitting elements 44A and 44B are made of materials such as a GaAs or InP series, and are of the distribution feedback type such that the emission surface of the laser is perpendicular to the main surface thereof. The photodiodes provided in the photodiode chips 42A and 42B are sensitive to an emission spectrum of the semiconductor laser chip.

Figure 3:
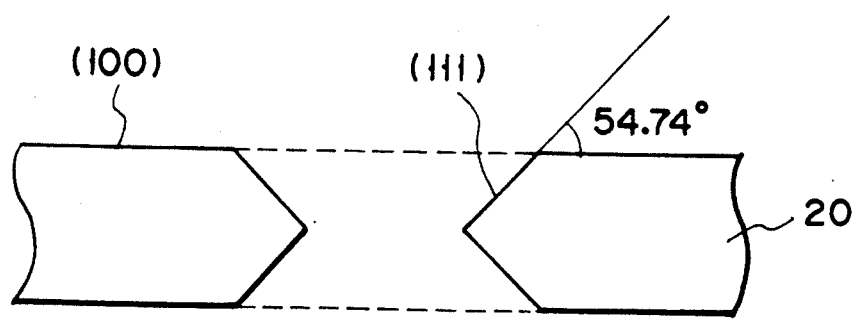
FIG. 3 is a cross-sectional view for explaining a method of forming an opening in a silicon substrate.

As is shown in FIG. 3, when the main surface (100) of the silicon substrate is subjected to wet etching, an (111) plane having an angle of 54.74° with the (100) plane is formed. Thus, the openings 50 are formed by performing wet etching on both sides of the silicon substrate 20.

Figure 4:
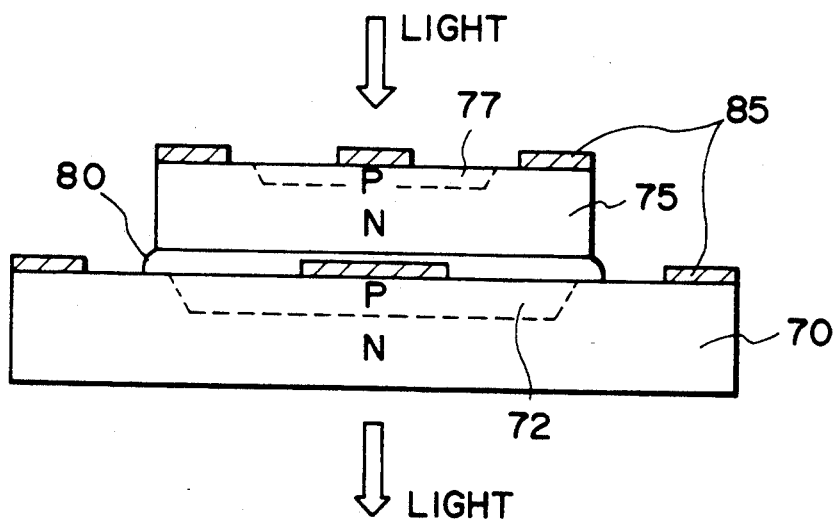
FIG. 4 is a diagram showing an example of the light transmit-receive elements used in the present invention.

FIG. 4 shows an example of the light transmit-receive element 40. A light emitting diode section 72 for performing optical transmission is obtained by forming a PN junction in a GaAs substrate 70. A photodiode section 77 for performing optical reception is obtained by forming a PN junction in a silicon substrate 75. The GaAs substrate 70 and the silicon substrate 75 are adhered by an adhesive 80. The transmit-receive elements 40 output a signal emitted by the light emitting diode section 72 (indicated by the lower arrow in FIG. 4) and receive a signal through the photodiode section 77 (indicated by the upper arrow in FIG. 4). Light transmit-receive elements 40 are connected to one another by wires or bumps. Further, electrodes 85 formed on the light transmit-receive elements 40 are connected to the silicon substrate 20 by wires or bumps, thereby electrically connecting the light transmit-receive elements 40 to the silicon substrate 20. A lens (not shown in FIG. 4) for converging the emitted light can be formed on the upper surface of the silicon substrate 75 or the lower surface of the GaAs substrate 70 with a macromolecular resin or glass.

Figure 5:
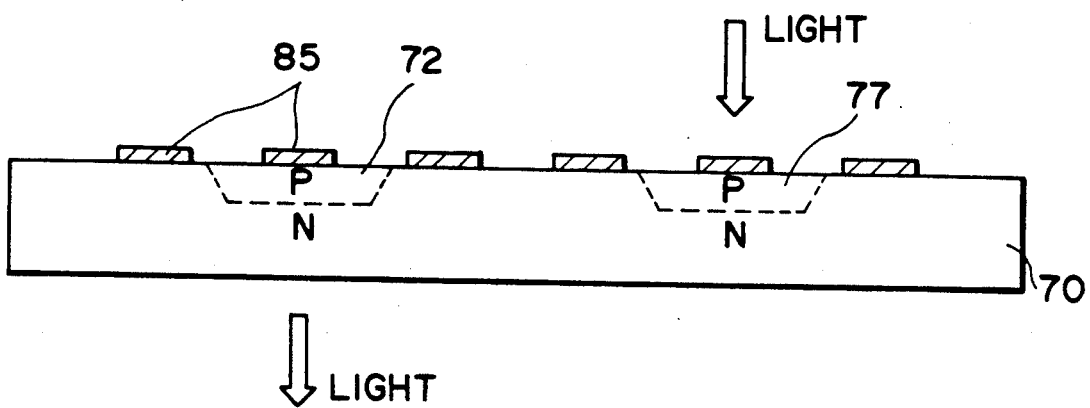
FIG. 5 is a diagram showing another example of the light transmit-receive elements used in the present invention.

FIG. 5 shows another example of the light transmit-receive element. A light emitting diode section 72 and a photodiode section 77 are integrally formed in the same surface region of a substrate 70 made of GaAs or the like. Electrodes 85 are also formed on the surface. A lens for converging (not shown in FIG. 5) can be formed on a portion of the light emitting diode section 72 or substantially entirely on the light emitting diode section 72 and the photodiode section 77.

A signal is transmitted as an optical signal between the semiconductor packaging substrates 10 of the semiconductor integrated circuit device as shown in FIG. 2. For example, when a signal is transmitted from an upper substrate to a lower substrate in FIG. 2, an electric signal output from the semiconductor integrated circuit 30 on the upper substrate is supplied through the multilayered wire 60 to the light transmit-receive element 40A, wherein the light emitting element 44A converts the electric signal to an optical signal. The optical signal is introduced through the lens 46A to the photodiode chip 42A of the lower substrate. The photodiode chip 42A converts the optical signal to an electric signal, which is supplied to the semiconductor integrated circuit 30 through the multilayered wire 60 on the lower substrate. On the other hand, when a signal is transmitted from a lower substrate to an upper substrate, the light transmit-receive element 40B on both substrates are used. More specifically, on the lower substrate, an electric signal output from the semiconductor integrated circuit 30 is supplied through the multilayered wire 60 to the optical transmit-receive element 40B, wherein the semiconductor laser chip 44B converts the electric signal to an optical signal. The optical signal is introduced through the lens 46B to the photodiode chip 42B of the upper substrate. The photodiode chip 42B converts the optical signal to an electric signal, which is supplied to the semiconductor integrated circuit 30 on the upper substrate.

Light transmit-receive elements 40A and 40B have the same structure as shown in FIG. 4 or FIG. 5 by connecting (for example, by wire bonding or bumps) to the substrate in the different manner.

Finally, the semiconductor integrated circuits 30 perform a predetermined processing in response to the received electric signal.

Figure 6:
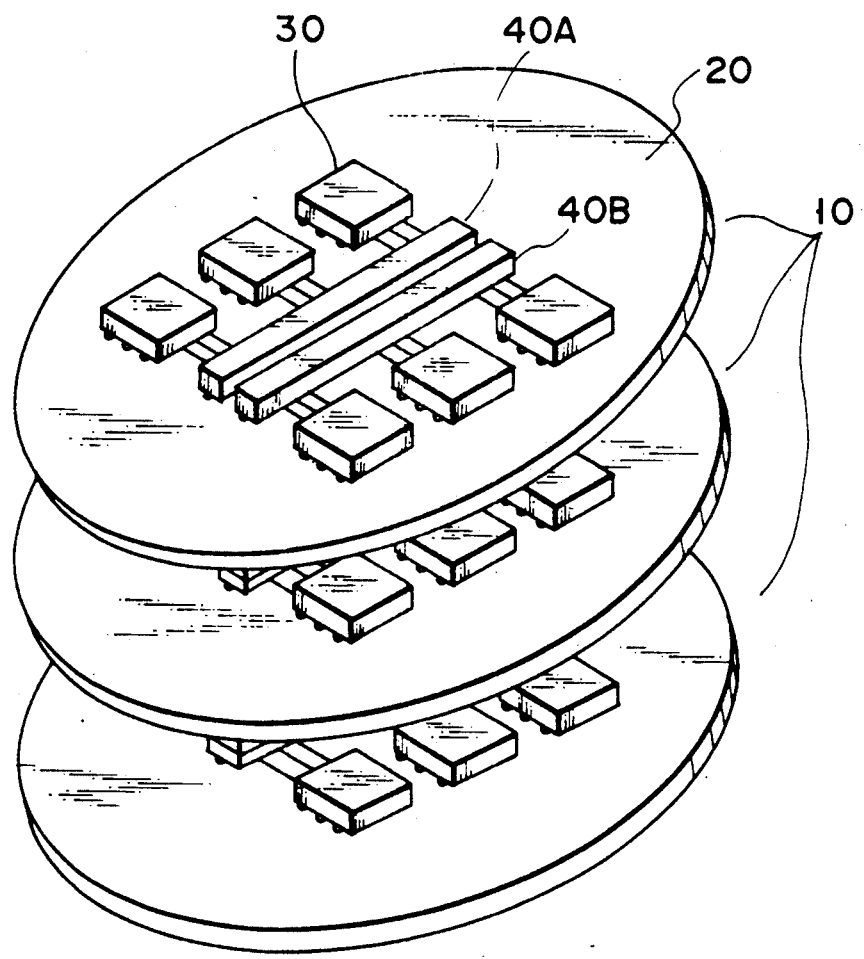
FIG. 6 is a perspective view schematically showing a semiconductor integrated circuit device according to a second embodiment of the present invention.

FIG. 6 is a perspective view schematically showing the semiconductor integrated circuit device according to a second embodiment of the present invention. This embodiment differs from the first embodiment in that light transmit-receive elements 40A and 40B are located in the center portion of a silicon substrate 20 of the semiconductor packaging substrate 10 and semiconductor integrated circuits 30 are positioned on the outer sides of the transmit-receive elements 40A and 40B. With this structure, since an optical signal transmission is performed between semiconductor packaging substrates 10 in the same manner as in the first embodiment, the same effect is obtained.

The above-described signal transmission by the optical signal between semiconductor packaging substrates is advantageous over the conventional signal transmission via electric paths in the following respects:

1) The signal delay does not depend on the time constant of the wire resistance and the capacitance, and the signal transmission rate is high.

2) Since little signal interference occurs, the crosstalk noise and the electromagnetic wave radiation are decreased. Thus, the signal transmission is little influenced by the crosstalk noise.

3) Reflection due to impedance mismatching does not occur.

4) No earth line is required.

5) Substrates can be arranged in parallel.

By virtue of the above advantages, a signal can be transmitted at a higher speed, e.g., 2 Gbps (giga bit per second) to 10 Gbps, and more reliably by the optical transmission technique than by the electric transmission technique. Hence, the speed of signal transmission between semiconductor packaging substrates can be greatly increased, thereby improving the capacity of the entire device.

The clock frequency of a semiconductor circuit will be as high as 100 MHz in near future. Then, a semiconductor packaging substrate having semiconductor integrated circuits which can perform a very complicated process at a high speed will possibly be produced. However, even in a semiconductor integrated circuit device having such a high-speed semiconductor integrated circuits, no delay time will arise between substrates since the operation speed of the integrated circuits cannot be higher than the transmission speed of light.

Although light is advantageous in signal transmission as described above, an element in which light in itself process a complicated signal has not been created. Thus, optical signal transmission is suitable for a simple switching circuit or the like. Thus the faster semiconductor integrated circuit device can be obtained by utilizing light transmission.

Figure 7:
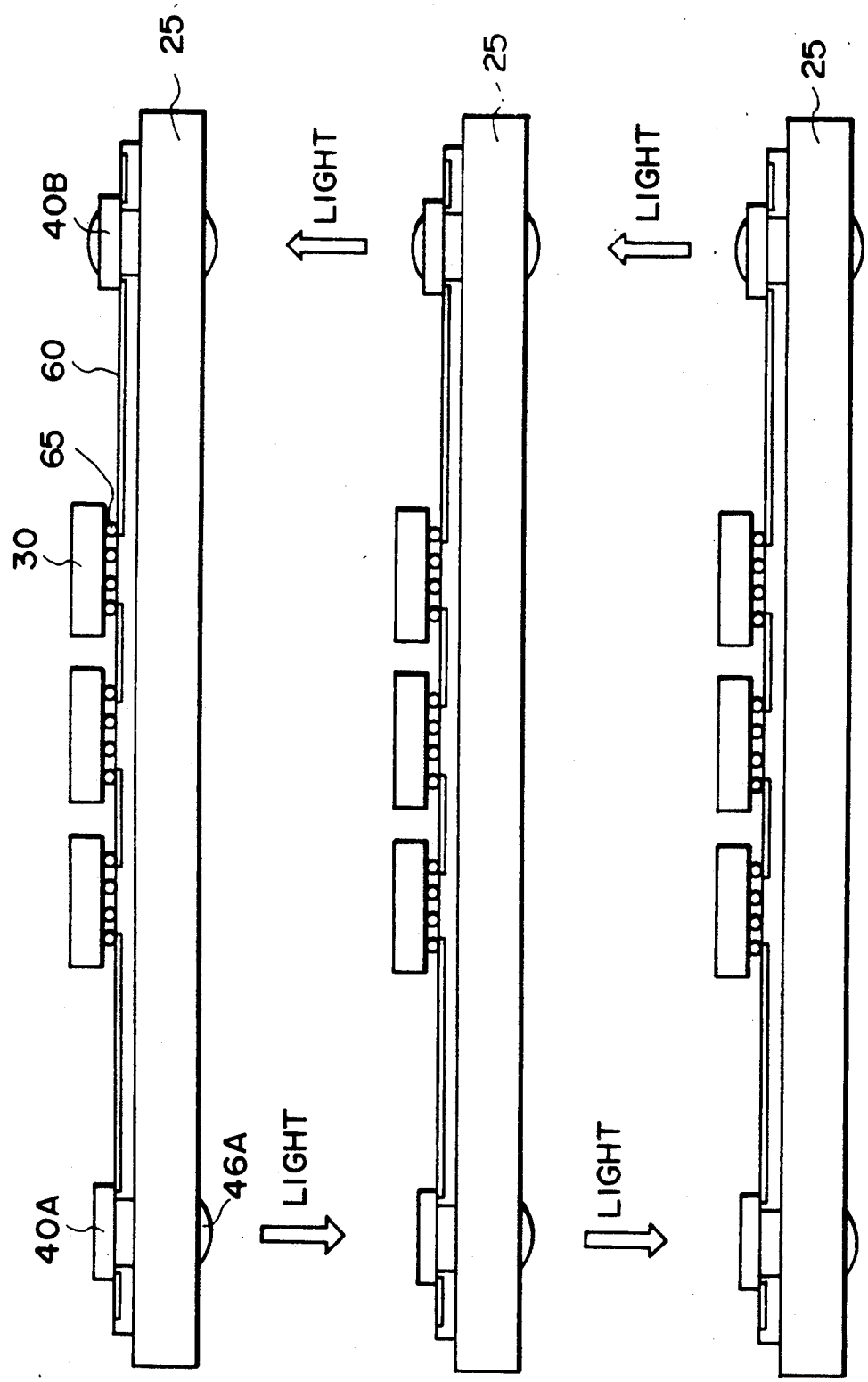
FIG. 7 is a cross-sectional view of the semiconductor integrated circuit device according to a third embodiment of the present invention.

FIG. 7 shows a cross section of the semiconductor integrated circuit device according to a third embodiment of the present invention. In FIG. 7, like reference numerals denote corresponding elements shown in FIGS. 1 and 2.

The third embodiment differs from the first embodiment in that the substrates are made of transparent crystallized AlN. Since the substrates are transparent, the opening 50 shown in FIG. 2 are not required.

As is shown in FIG. 7, a multilayered wiring layer 60 is formed on a transparent crystallized AlN substrate 25. Semiconductor integrated circuits 30 are electrically connected to the multilayered wiring layer 60 on the AlN substrate 20 by means of bumps 65 by a flip chip method. The semiconductor integrated circuits 30 are made of silicon ($\alpha = 3.0 \times 10^{-6}$) and have a coefficient of thermal expansion substantially the same as that of the AlN substrate 25 ($\alpha = 4.5 \times 10^{-6}$). Since no thermal stress is applied to the bumps used in the flip chip method for this reason, the semiconductor integrated circuits 30 made of silicon and the AlN substrate 25 are connected and attached reliably. The multilayered wiring layer 60 is formed by spin-coating polyimide or the like on an interlayer insulating layer and drying the same. Wires are formed by sputtering or vapor-depositing metal such as copper or aluminum on the entire surface of the substrate and thereafter patterning the metal layer by a photoetching process. The semiconductor integrated circuits are mounted on the substrate at a high density by the flip chip method, thereby suppressing the delay of an electric signal transmission between semiconductor integrated circuits 30 to a minimum degree. Moreover, by virtue of the reduction of load capacitance due to the high-density mounting, the power consumed by the signal transmission between the semiconductor integrated circuits 30 is reduced.

A signal transmission between the AlN substrates 25 is performed by an light transmit-receive element 40A and 40B (a unit or an array like element). The light transmit-receive elements 40A and 40B convert an electric signal from the semiconductor integrated circuit 30 to an optical signal, and from an optical signal to an electric signal, which is supplied to the semiconductor integrated circuit 30. As a result of the conversion, the elements 40A and 40B generate a large amount of heat. The light transmit-receive elements 40A and 40B are adhered directly to the AlN substrate 25 by a transparent adhesive. The heat generated in the light transmit-receive elements 40A and 40B is transmitted to the AlN substrate 25 and radiated therethrough. Although the light transmit-receive elements 40A and 40B, made of GaAs or the like, have a coefficient of thermal expansion different from that of the AlN substrate 25, it does not cause any inconvenience in adhesion since the element 40A is much smaller than the AlN substrate 25.

An optical signal emitted from a first light transmit-receive element 40A provided on top of one surface of a first transparent crystallized AlN substrate 25 passes therethrough and is received by a second light transmit-receive element 40A disposed on the corresponding portion of an adjacent AlN substrate 25 located above or below the first AlN substrate 25. A semi-spherical lens 46A made of glass or macromolecular resin is adhered on the other surface of the first AlN substrate 25 to focus light on the second light transmit-receive element 40A provided on the adjacent AlN substrate 25. Thus, an optical signal is transmitted and received.

Figure 8:
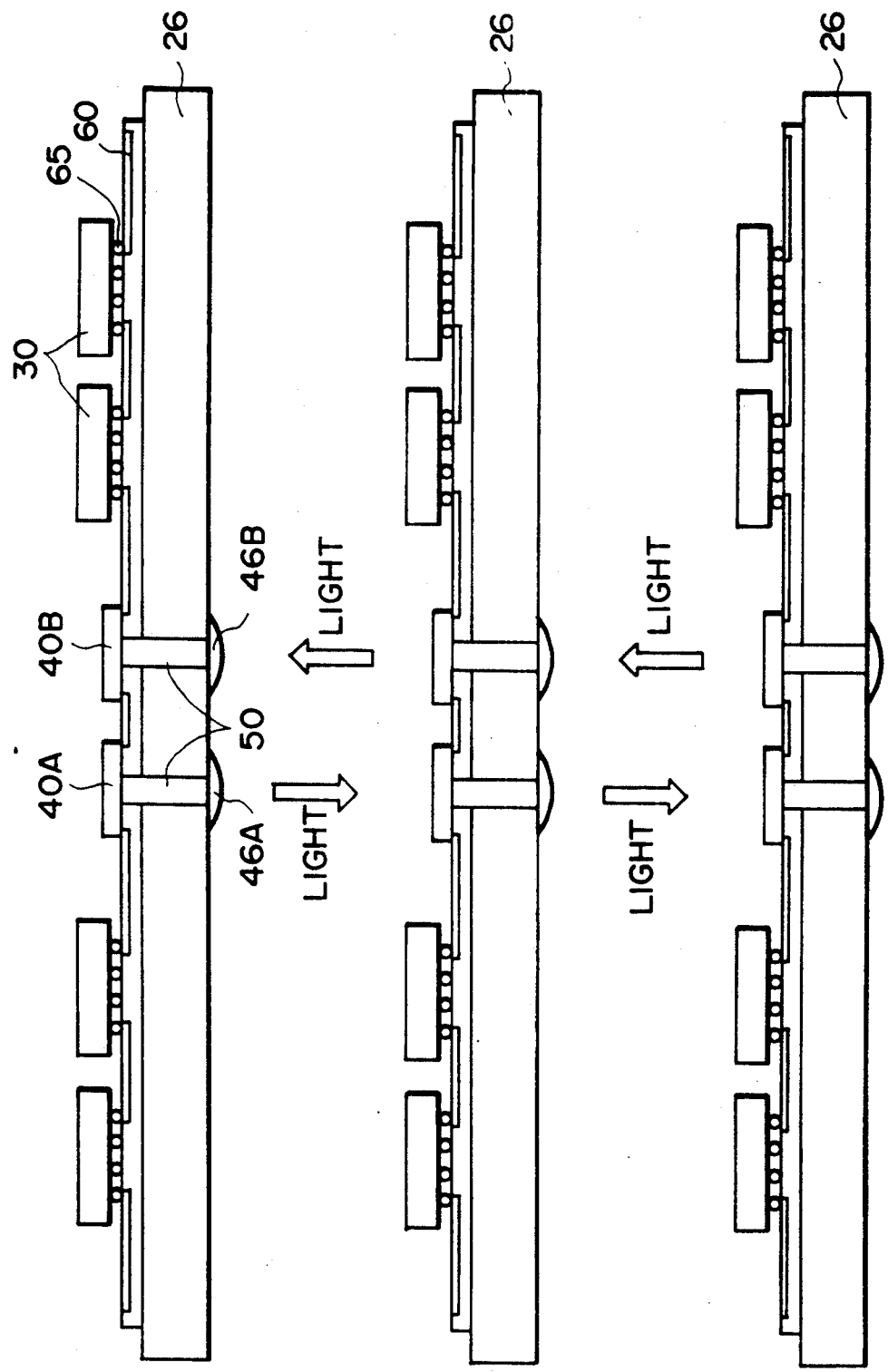
FIG. 8 is a cross-sectional view of the semiconductor integrated circuit device according to a fourth embodiment of the present invention.

FIG. 8 is a cross-sectional view schematically showing the semiconductor integrated circuit device according to a fourth embodiment of the present invention. A non-transparent ceramic AlN substrate 26 has through holes 50. Light transmit-receive elements 40A and 40B are provided on one surface of, the substrate so as to cover the holes 50. Semi-spherical lenses 46A and 46B made of glass or macromolecular resin are mounted on the other surface of the substrate at positions corresponding to the elements 40A and 40B. The lenses 46A and 46B focus light in the same manner as in the third embodiment to transmit and receive an optical signal.

Figure 9:
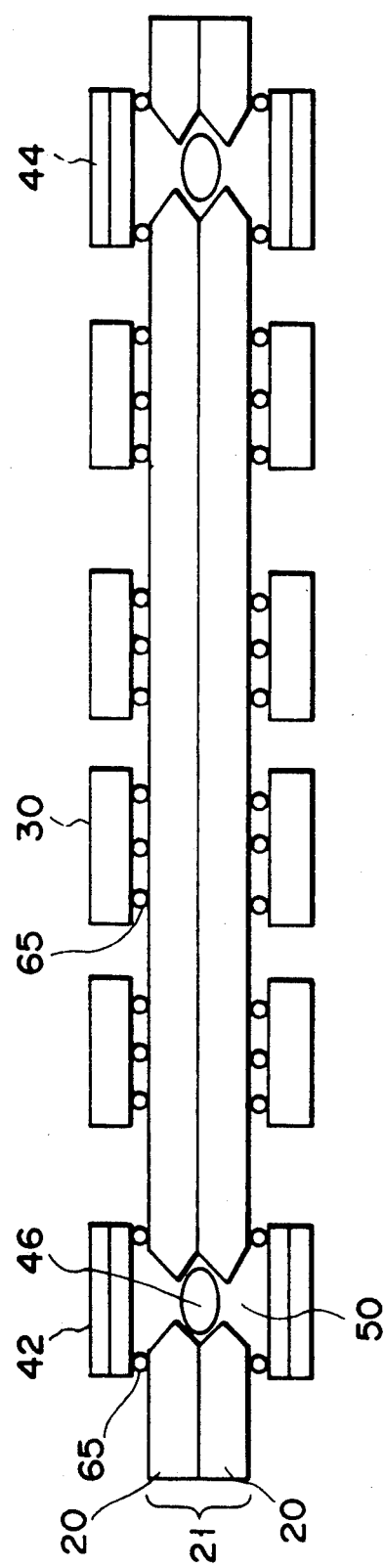
FIG. 9 is a cross-sectional view of the semiconductor integrated circuit device according to a fifth embodiment of the present invention.

FIG. 9 shows a cross section of the semiconductor integrated circuit device according to a fifth embodiment of the present invention. The semiconductor integrated circuit device of this embodiment comprises a silicon substrate 21 constituted by two silicon substrates 20 as used in the first embodiment, semiconductor integrated circuits 30 mounted on the upper and lower surfaces of the silicon substrate 21 and connected by bumps 65, light transmit-receive elements 42 having no lens and mounted on the upper and lower surfaces of the silicon substrate 21, and lenses 46 each provided in openings 50.

With this structure, the same effect as in the first embodiment is obtained. Moreover, since the semiconductor integrated circuits 30 are provided on both sides of the silicon substrate 21, the integration density is higher than in the first embodiment.

Figure 10:
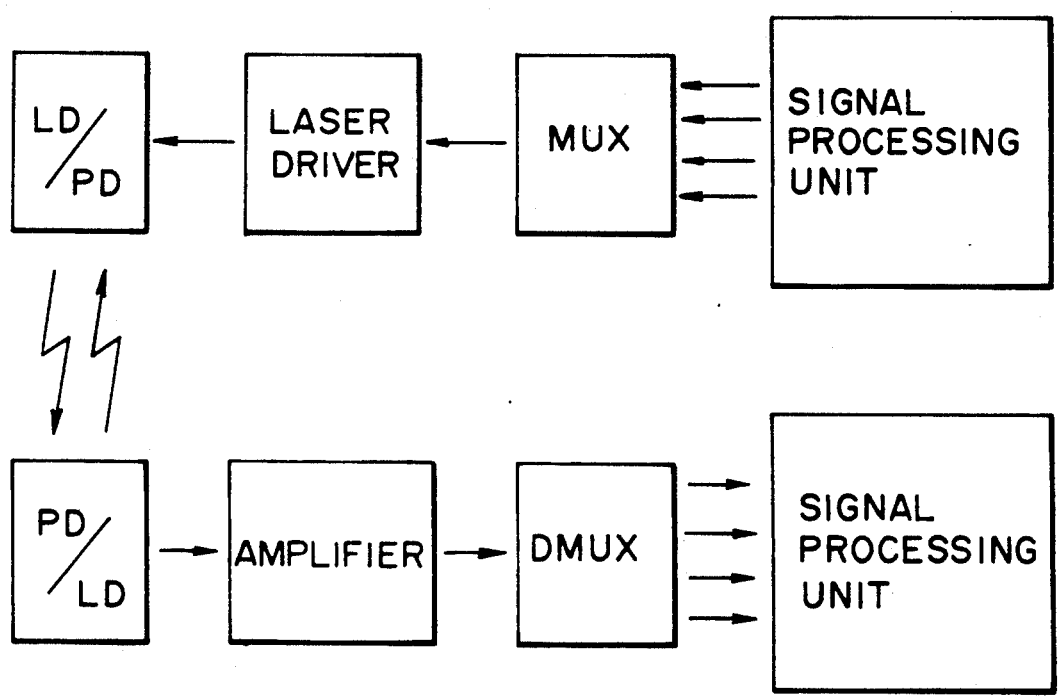
FIG. 10 is a block diagram for explaining means for solving the problem arising in a case where the operation speed of the semiconductor integrated circuit differs from the optical signal transmission speed.

This invention is not limited to the above-described embodiments. For example, if the operation speed of a semiconductor integrated circuit differs from the optical signal transmission speed, problems arising from the difference can be solved by the structure shown in FIG. 10. A signal is processed in the structure in the following procedures. A plurality of process signals output from semiconductor integrated circuits on a substrate are converted by a multiplexer (MUX) to a high-speed electric signal. The electric signal is supplied to a laser driver and converted to an optical signal by a semiconductor laser. The optical signal is introduced to a photodiode on another semiconductor packaging substrate and converted to an electric signal. The electric signal is supplied to a demultiplexer (DMUX) and converted to the plurality of electric signals, which is supplied to a semiconductor integrated circuit and processed. In the above processing, if the level of the signal output from the photodiode is low, a signal amplifier may be provided between the photodiode and the demultiplexer to amplify the signal.

As in the above embodiments, the light transmit-receive element 40 may be formed on a center portion or a peripheral portion of the substrate 20. Lenses 46 may be formed directly on the surface of the light transmit-receive element 40 or on the opposite surface of the substrate on which the light transmit-receive element 40 is formed.

As has been described above, the present invention can be modified within the spirit and scope of the invention.

What is claimed is:

1. A semiconductor integrated circuit device comprising:
   a plurality of semiconductor packaging substrates arranged parallel to one another;
   at least one opening selectively formed on each of said semiconductor packaging substrates;
   a plurality of semiconductor integrated circuits mounted on a portion of each of said semiconductor packaging substrates which excludes said opening;
   light transmit-receive means having at least one light emitting element and at least one light receiving element which are formed integral with each other on each opening, for performing optical signal transmission between said semiconductor packaging substrates, said light transmit-receive means converting electric signals output from a semiconductor integrated circuit on one semiconductor packaging substrate to an optical signal and outputting the optical signal to another semiconductor packaging substrate, and converting an optical signal received from another semiconductor packaging substrate to electric signals and outputting the electric signal to said semiconductor integrated circuit; and
   wires for electrically connecting said semiconductor integrated circuits on each of said semiconductor packaging substrates with each other and connecting said semiconductor integrated circuits on each thereof to said light transmit-receive means,
   wherein said semiconductor integrated circuits perform predetermined batch-process of electric signals, respectively.

2. A semiconductor integrated circuit device according to claim 1, wherein said semiconductor packaging substrate is made of silicon.

3. A semiconductor integrated circuit device according to claim 1, wherein said semiconductor packaging substrate is made of non-transparent Al.

4. A semiconductor integrated circuit device according to claim 1, wherein said light transmit-receive means includes a photodiode chip for receiving an optical signal from another semiconductor packaging substrate and a semiconductor laser chip for transmitting an optical signal to another semiconductor packaging substrate.

5. A semiconductor integrated circuit device according to claim 4, further comprising a lens for converging light.

6. A semiconductor integrated circuit device according to claim 1, wherein each of said semiconductor packaging substrates has at least one opening and said light transmit-receive means is constituted by light transmit-receive elements which are respectively provided on said openings.

7. A semiconductor integrated circuit device comprising:
   at least two semiconductor packaging substrates superposed on one another, each of said semiconductor packaging substrates having at least one opening at a position corresponding to that of another semiconductor packaging substrate;
   a plurality of semiconductor integrated circuits selectively mounted on a portion of the exposed surface of each of said semiconductor packaging substrates which excludes said opening;
   a lens provided in each opening;
   light transmit-receive elements each having at least one light emitting element and at least one light receiving element which are formed integral with each other and covering ends of each opening; and
   wires for electrically connecting said semiconductor integrated circuits on each of said semiconductor packaging substrates with each other and connecting said semiconductor integrated circuits on each thereof to said light transmit-receive means,
   wherein said semiconductor integrated circuits perform predetermined batch-process of electric signals, respectively.

8. A semiconductor integrated circuit according to claim 7, wherein said light transmit-receive elements constitute light transmit-receive means.

9. A semiconductor integrated circuit device comprising:
   a plurality of semiconductor packaging substrates arranged parallel to one another;
   a plurality of semiconductor integrated circuits mounted one each of said semiconductor packaging substrates;
   connecting means for electrically connecting said semiconductor integrated circuits on each of said semiconductor packaging substrates with each other;

optical signal transmitting means, electrically connected to at least one of said semiconductor integrated circuits on each of said semiconductor packaging substrates, for converting electric signals input by said semiconductor integrated circuits on one semiconductor packaging substrate to an optical signal and outputting the optical signal to another semiconductor packaging substrate; and optical signal receiving means, electrically connected to at least one of said semiconductor integrated circuits on each of said semiconductor integrated circuit substrates, for receiving an optical signal output from one semiconductor packaging substrate, converting the optical signal to electric signals, and outputting the electric signals to said semiconductor integrated circuits, wherein said semiconductor integrated circuits batch-process electric signals and said optical signal transmitting means and said optical signal receiving means are formed integral with each other.

10. A semiconductor integrated circuit device according to claim 9, wherein said semiconductor packaging substrate is transparent for light signals emitted by said optical signal transmitting means.

11. A semiconductor integrated circuit device according to claim 9, wherein said semiconductor packaging substrates are formed of transparent AlN.

12. A semiconductor integrated circuit device according to claim 9, wherein said optical signal transmitting means is constituted by one of a light emitting diode and a semiconductor laser chip.

13. A semiconductor integrated circuit device according to claim 9, wherein said optical signal receiving means is constituted by a photodiode chip.

14. A semiconductor integrated circuit device according to claim 9, wherein said receiving and transmitting means includes a lens for converging light.

15. A semiconductor integrated circuit device according to claim 9, wherein said receiving and transmitting means is constituted by a plurality of transmit-receive elements.

* * * * *